United States Patent [19]

Fabry et al.

[11] Patent Number: 5,219,613
[45] Date of Patent: Jun. 15, 1993

[54] PROCESS FOR PRODUCING STORAGE-STABLE SURFACES OF POLISHED SILICON WAFERS

[75] Inventors: Laszlo Fabry, Emmerting; Manfred Grundner; Peter John, both of Burghausen, Fed. Rep. of Germany; Wolfgang Feichtner, Ach, Austria; Dieter Graefg, Burghausen; Rosemarie Winklharrer, Marktl, both of Fed. Rep. of Germany

[73] Assignee: Wacker-Chemitronic Gesellschaft fur Elektronik-Grundstoffe mbH, Burghausen, Fed. Rep. of Germany

[21] Appl. No.: 863,394

[22] Filed: Apr. 3, 1992

Related U.S. Application Data

[63] Continuation of Ser. No. 712,341, Jun. 7, 1991, abandoned.

[30] Foreign Application Priority Data

Jun. 13, 1990 [DE] Fed. Rep. of Germany ....... 4018984

[51] Int. Cl.$^5$ .................... H01L 21/302; B05D 3/04
[52] U.S. Cl. .................................. 437/235; 427/301; 427/387; 437/238
[58] Field of Search ............... 437/235, 238; 427/299, 427/301, 387

[56] References Cited

U.S. PATENT DOCUMENTS

| | | | |
|---|---|---|---|
| 4,724,171 | 2/1988 | Lampert | 427/299 |
| 4,973,563 | 11/1990 | Prigge et al. | 427/299 |
| 5,008,127 | 4/1991 | Ogawa | 427/299 |

Primary Examiner—Olik Chaudhuri
Assistant Examiner—Ourmazd S. Ojan
Attorney, Agent, or Firm—Collard & Roe

[57] ABSTRACT

Silicon wafers are first subjected to an oxidative treatment and subsequently to exposure to organosilicon compounds which contain at least one radical in the molecule which is hydrolyzably bound to the silicon and at least one radical in the molecule having hydrophilic properties. Depending on the compound selected, more or less strongly hydrophilic or hydrophobic properties of the silicon surface can consequently be established under mild conditions. The wafers treated in such a manner have a high storage stability and retain their surface nature even under difficult climatic circumstances. The surface nature present after the oxidative treatment can then be restored particularly easily by hydrolysis.

10 Claims, No Drawings

PROCESS FOR PRODUCING STORAGE-STABLE SURFACES OF POLISHED SILICON WAFERS

This is a continuation of copending application(s) Ser. No. 07/712,341 filed on Jun. 7, 1991, now abandoned.

BACKGROUND OF THE INVENTION

1. Field of the Invention

The present invention relates to a process for producing storage-stable surfaces of polished silicon wafers by oxidative treatment and subsequent exposure to organosilicon compounds.

2. The Prior Art

The separation in space and time between the production of semiconductor wafers as a starting material and their further processing to produce electronic components as the true final product often results in transportation and storage times of different lengths for the wafers. At the same time, the component producers demand that, regardless of this period of time and the influences active in the course thereof, the semiconductor wafers used always have an identical and reproducible wafer quality and thereby guarantee a reproducible behavior in the sensitive production processes.

On the other hand, it is known that the perfect wafer surface produced in the polishing operation is exposed, even immediately after the latter has been completed, to a wealth of influences, for example, water due to washing solutions and, in particular, the ambient atmosphere, which may affect the surface quality. In this connection, the atmospheric effects during transportation and storage, for example, due to the varying period of time and the climatically and/or seasonally induced differences, which are often great, between the different producer countries (temperature, atmospheric humidity and contamination of the atmosphere with, for example, hydrocarbons) deserve special attention. This is because they may result in varying behavior of the wafers in the initial tests and/or some process steps during the component production.

Even the process specified by W. Kern and D. Puotinen in *RCA Review*, Jun. 1970, pages 187-206 (so-called "RCA cleaning"), in which the polished wafer surface is coated with a thin layer of partially hydrated silicon dioxide by oxidative treatment, for example, by immersion in a hydrogen peroxide/ammonia solution, cannot, as a rule, permanently prevent the contamination of the surface with the virtually ubiquitous hydrocarbons. In addition, as a result of aging effects, the structure of the protective layer also alters, especially during prolonged storage times. During epitaxial processes or thermal oxidation steps, for example, this may result in a misty cloudiness ("haze") on the polished surface, which manifests itself as a diffuse surface reflections when, for example, the wafer surface is examined in focused light.

According to German Offenlegungsschrift 3,540,469, of the corresponding U.S. Pat. No. 4,724,171, this effect can be prevented by treating the oxidized silicon surface with hexamethyldisilazane, the protective action being explained by the OH groups of the wafer surface reacting by trimethylsilylation and, consequently, being withdrawn from the aging process which presumably takes place with the condensation of water between the various OH groups. Silicon wafers treated in this way exhibit an excellent storage stability, but have a hydrophobic wafer surface which is held in little esteem by component producers and which, in addition, is still comparatively carbon-rich (theoretically, three methyl groups per bound silicon). A water drop applied to such a hydrophobic wafer surface, for example, contracts and often assumes even an almost spherical shape, whereas, on a hydrophilic wafer surface, it spreads and sometimes even drains off. The wetting angle between the wafer surface and the drop surface can be used to test and at least approximately measure the hydrophilic or hydrophobic surface properties and their change during storage.

SUMMARY OF THE INVENTION

It is, therefore, an object of the present invention to provide a process by which silicon surfaces having improved storage stability can be obtained and which makes possible, in particular, the controlled adjustment of the surface properties between the more hydrophilic or the more hydrophobic state and also makes possible a low carbon coverage of the wafer surface.

A further object of the present invention comprises selecting as active organosilicon compounds those which contain at least one radical in the molecule which is hydrolyzably bound to silicon and at least one radical in the molecule having hydrophilic properties.

The above objects are accomplished, according to the present invention, by providing a process for producing storage-stable surfaces of polished silicon wafers comprising oxidative treatment of the silicon wafers; subsequently exposing the silicon wafers to an active organosilicon compound; and selecting as said active organosilicon compound one which contains at least one radical in the compound which is hydrolyzably bound to silicon and at least one radical in the compound having hydrophilic properties.

The prior oxidative treatment of the silicon wafer, as a result of which its surface is coated with a thin oxide layer, can be carried out in a known manner, for example, in aqueous alkaline solution, in particular, ammoniacal hydrogen peroxide solution (for example, analogously to the procedure in the "RCA cleaning"), in aqueous acidic solution, in particular hydrogen peroxide solution containing hydrochloric acid, or in an ozone-containing aqueous solution. Solutions which contain, for example, hypochlorites such as, for instance, sodium hypochlorite, as oxidizing agent are also suitable. The wafers can also be oxidized anodically in alkaline solution. In the last mentioned cases, however, a possible contamination of the wafer surface with interfering cations must be borne in mind. In addition, there is also the possibility of oxidation via the gas phase, which may be carried out, for example, by exposure to ozone or as a so-called thermal oxidation in a dry or moist oxygen-containing atmosphere.

Subsequent to such an oxidative treatment, which possibly comprises even a combination of a plurality of steps, the wafers, which are, as a rule, in a single-sidedly or double-sidedly polished form and consequently have at least one polished wafer surface, are advantageously also washed and dried in order to prevent interfering side reactions with the organosilicon compounds to which they are subsequently exposed. Expediently, the wafers are subjected to this exposure as promptly as possible subsequent to the oxidative treatment, although, according to experience, waiting times of up to about 12 hours have been found to be still tolerable.

The organosilicon compounds provided may be used as individual compounds or as two-component or multi-component mixtures.

In principle, it is possible to expose the wafer surface to the organosilicon individual compounds or mixtures selected as reagent, in a particular case, in liquid form, advantageously dissolved in a solvent, such as, for instance, trifluorotrichloroethane, for example, by spraying on, pouring on, spinning on or immersion. More beneficial, and preferable even for purity reasons, however, is exposure via the gas phase, advantageously via a carrier gas or carrier gas mixture such as nitrogen, argon, hydrogen, carbon dioxide, freons (such as, for instance, $CF_2Cl_2$) or air, in which case the oxidation susceptibility of the compounds has to be borne in mind, enriched with the compounds provided. At the same time, the enrichment can be carried out and controlled in the known manner, for example, by means of metering devices such as temperature-controlled evaporators ("bubblers"). Suitable for the gas treatment of the wafers are the reaction chambers or receptacles which are standard for gas treatments in semiconductor technology. A particularly simple possibility is to introduce a small quantity, i.e., as a rule, one or more drops, of the reagent into the intended package and to produce, in this way, a gas phase suitable for reaction with the wafer surface.

Advantageously, in particular in relation to the latter variant, those organosilicon compounds are selected whose vapor pressure is sufficiently high under the normal climatic conditions to ensure a proportion in the gas phase which is sufficiently high for the interaction with the wafer surface without additional measures. In general, this requirement is best fulfilled by those compounds whose vapor pressure corresponds, under normal conditions (25° C./1000 hPa), to a value of at least 0.5, preferably 5 to 500 hPa. According to experience, however, even compounds having still lower vapor pressures can be used, since the wafer surface itself is capable of reacting with small proportions of such organosilicon compounds in the ambient atmosphere.

The use of those organosilicon compounds in which the at least one radical hydrolyzably bound to silicon is a fluoro, chloro, bromo, hydroxy or alkoxy, in particular methoxy or ethoxy radical has proved beneficial. Organosilicon compounds having more than one radical in the molecule which is hydrolyzably bound to silicon can also be used, in which case alkoxy, in particular, ethoxy and preferably methoxy radicals, are preferably considered. Examples of such compounds containing several radicals in the molecule which are hydrolyzably bound to silicon are, for instance, tetraethoxysilane or tetramethoxysilane.

In principle, the radicals mentioned, in particular the alkoxy, preferably methoxy or ethoxy radicals are also suitable as radicals having hydrophilic properties since their bond to the silicon of the wafer surface is able to cleave hydrolytically in the presence of water or aqueous acidic or alkaline solutions and, as a result, a hydrophilic wafer surface is ultimately formed again. Also suitable are radicals which are bound to the silicon via a carbon atom and carry one or more functional groups having hydrophilic properties such as, for instance, hydroxymethyl or hydroxyethyl derivatives, glycol derivatives or derivatives of carboxylic acids or carboxylic acid anhydrides such as, for example, acetyl or acrylic acid radicals or succinic anhydride radicals.

The number of hydrophilic radicals and/or the more or less strongly pronounced hydrophilic nature of the radicals bound to silicon in the molecule in the case of the organosilicon compounds selected in a particular case consequently enables the resultant hydrophilic nature of the wafer surface to be influenced. Ultimately, the process according to the invention, therefore, makes it possible to adjust the wafer surfaces to strongly hydrophilic, weakly hydrophilic or even approximately hydrophobic properties as required. For example, more strongly hydrophilic wafer surfaces can be produced by exposure to tetramethoxysilane than by exposure to dimethoxy-dimethylsilane.

In the case of compounds analogous to those last mentioned, which therefore contain not only substituents whose bond to the silicon is hydrolyzable or which have hydrophilic properties, alkyl radicals have proved advantageous as further substituents, those being suitable, in particular, which contain as few carbon atoms as possible. Alkyl or dialkyl derivatives are, therefore, preferably used, the methyl or dimethyl compounds and also the ethyl or diethyl compounds, in particular, having proved particularly advantageous. Ultimately, such organosilicon compounds, which are especially suitable for preparing less strongly hydrophilic wafer surfaces, therefore contain a maximum of one carbon atom or two carbon atoms in the molecule which are directly bound to silicon per silicon atom.

Examples of organosilicon compounds which are, according to experience, particularly well-suited and contain at least one radical hydrolyzably bound to silicon and a hydrophilic radical and which contain, at the same time, a comparatively low proportion of carbon are tetramethoxysilane, methoxychlorodimethylsilane, mixtures of these two compounds, preferably in the ratio of 1:3 to 1:9, mixtures of tetramethoxysilane and dimethoxymethylchlorosilane, advantageously in the same mixing range, and also di(2-chloroethoxy)dimethylsilane or dimethyldimethoxysilane.

An advantage of the process is that the actual exposure of the wafer surface to the compounds can, in most cases, be carried out even at room temperature. In principle, however, the possibility is not ruled out of using, on the contrary, elevated temperatures, in which case temperatures of up to 150° C., preferably 20° C. to 60° C. have proved to be well-suited.

The necessary exposure times vary, in general, with the reactivity of the compounds used in a particular case and are expediently determined on the basis of preliminary experiments. As a rule, however, periods of time of about 5 to 200 minutes are adequate for an effective treatment of the wafer surface, unless recourse is, in any case, made to the process variant that the wafers are permanently exposed to an atmosphere enriched with the chosen organosilicon compounds in the package.

The effect of the organosilicon compounds chosen in a particular case is presumably due to the fact that the at least one radical which is hydrolyzably bound to silicon is capable of reacting with SiOH groups present on the oxidatively treated wafer surface, in which process the residual silyl radical is bonded via an Si—O—Si bond to the wafer surface in a type of condensation reaction with the elimination of the corresponding hydrogen compound of the hydrolyzable radical (for example, methanol, ethanol, water, hydrogen chloride, etc.). A particular advantage in this connection is that the reaction products liberated in this process are either unable to exert an influence on the silicon surface (such as, for example, methanol) or, alternatively, are even able to serve to activate hydrophilic centers (such as, for instance, water which can activate, for example, carboxylic acid anhydrides or methoxy groups).

The surfaces of silicon wafers treated in such a manner exhibit an excellent storage stability, even under extremely adverse storage conditions, such as, for instance, storage for several days or several weeks at 35° C. in an atmosphere saturated with water vapor, which is described as a "tropical test." This applies, for example, to the resistance to changes in the hydrophilic properties of the wafer surface and also to the increase in the number of particles detected on it, which are an important acceptance or rejection criterion in the component producer's initial tests. Because of the low adhesion forces on hydrophilic surfaces, the particles can be more easily cleaned off, even compared with hydrophobic wafers. Moreover, the hydrophilic, and consequently lipophobic nature of the wafer surface also markedly reduces the adsorption of hydrocarbons and, consequently, the undesirable SiC formation in subsequent high-temperature steps.

Furthermore, the silicon wafers can be introduced into the standard component production processes even after long storage. At the same time, a hydrophilic wafer surface offers the advantage that the component producer's initial processes, which are, as a rule, adapted to hydrophilic wafer surfaces, do not require any adjustment.

In addition, the surface layer formed in the process according to the invention can easily be removed again, and the original hydrophilic surface state restored by subjecting the wafers to a hydrolytic treatment in an alkaline or preferably, acidic aqueous solution, as a result of which the Si—O—Si bonds formed are split up again. In this connection, the particular advantage is that this splitting proceeds even under mild conditions and can, therefore, be carried out using weakly alkaline or preferably weakly acidic aqueous solutions. Such a step can then be followed by the actual further treatment.

In principle, however, a treatment producing such a suitable initial state of the water surface can also be carried out in the conventional manner. For example, before the first process step, the wafer surface can, as a rule, be subjected to an oxidation in aqueous medium, to a thermal oxidation or to a treatment by means of hydrofluoric acid, which strips off the organosilicon layer, before the actual first process step and is, consequently, available in the low-carbon initial state desirable for subsequent process steps.

The present invention will now be further disclosed by reference to the following examples which are supplied solely for the purpose of illustration and are not intended to define the limits and scope of the present invention.

EXAMPLE 1

Subsequent to a two-sided polishing carried out in the standard manner, a hundred and fifty silicon wafers (diameter approximately 150 mm (100) orientation) were first freed of polishing residues and then subjected to an oxidative cleaning composed of two substeps in which a one-minute treatment with approximately 0.6% by weight aqueous hydrofluoric acid was followed by a ten-minute treatment in ammoniacal hydrogen peroxide solution. These two substeps consequently corresponded essentially to those of the so-called "RCA cleaning." After final rinsing and drying, the wafers had oxidized polished surfaces which had hydrophilic properties. A water drop (drop volume approximately 10 $\mu$l) applied for the purpose of testing to the center of a wafer drained off completely and consequently revealed the strongly hydrophilic nature of the surface.

Groups of 25 wafers each were now introduced into a polyethylene packaging unit which is standard for the storage and dispatch of semiconductor wafers and which is composed of a carrier element and a bottom part and covering part.

In various ways, an atmosphere which contained organosilicon compounds suitable for the process according to the invention was now built up in each of the packaging units. Then the package was wrapped in a gas-tight manner in a polyethylene sheet, and the wafers contained in it were exposed to the atmosphere established for a certain exposure time at room temperature.

Five wafers were then removed from each package and investigated by means of a semiquantitative test method for hydrophilic or hydrophobic nature of the wafer surface. For this purpose, a drop of fully demineralized water having a volume of approximately 10 $\mu$l was applied to the center of the horizontally aligned wafer with the aid of a dropping pipette. According to experience, with increasingly hydrophobic surface properties, the drop contracts to an ever increasing extent and assumes an approximately spherical shape, whereas with increasing hydrophilic nature of the wafer surface, it spreads out and flattens off to an ever increasing extent and finally drains off. An approximately quantitative measurement is possible on the basis of the wetting angle which forms between drop and wafer surface and which can be measured, for example, particularly effectively with the aid of a video camera, if the latter is aimed at the wafer so that the wafer surface is depicted as a straight line and the drop as a projection of a more or less severely deformed sphere. The angle which a tangent drawn to the liquid surface at the contact edge with the wafer surface encloses with the plane of the wafer is then measured as the wetting angle. In this connection, values of above 25° indicate the increasingly hydrophobic nature of the wafer surface and, below this value, an increasingly hydrophilic nature.

After being loaded with wafers, 55 $\mu$l of di(2-chloroethoxy)dimethylsilane were added dropwise to the package A before closure. After a two-hour exposure time, measurement of the wetting angle for the wafers removed yielded a value of approximately 65°, which indicated a hydrophobic nature for the wafer surface.

After being loaded with wafers, the interior space of the package B was flushed with a tetramethoxysilane/nitrogen mixture, in which process the proportion of silane in the carrier gas was adjusted with the aid of a "bubbler" through which the latter flowed and was filled with silane. Then the package was closed, and the atmosphere was allowed to enter into interaction with the wafer surfaces for approximately 20 minutes. For the wafers then removed, a wetting angle of approximately 20°, corresponding to a markedly hydrophilic nature of the wafer surface, was obtained.

After being loaded with wafers, a mixture of tetramethoxysilane and chloromethoxydimethylsilane was added dropwise to the package C in an amount of 50 $\mu$l; the mixing ratio (proportions by volume) was 1:9. After a twenty-minute exposure time with the package closed, the wafers removed exhibited a wetting angle of approximately 60° and, consequently, a hydrophobic nature.

After being loaded with wafers, a mixture of tetramethoxysilane and chloromethoxydimethylsilane was added dropwise to the package D in an amount of 50 μl; the mixing ratio (proportions by volume) was 1:4. After a twenty-minute exposure time with the package closed, the wafers removed exhibited a wetting angle of approximately 60° and, consequently, a hydrophobic nature.

EXAMPLE 2

The wafers left in the packages A to D in Example 1 (20 specimens in each case) were subjected to a test of their storage stability after rapidly closing the package. For this purpose, the closed packages were kept in a climatic chamber for five days at 35° C. in air saturated with water vapor.

In a control experiment, twenty wafers which had experienced both the substeps of the oxidative cleaning procedure described in Example 1 and, consequently, had a hydrophilic surface, were subjected to the same treatment in a package E.

In a further control experiment, twenty wafers which had experienced a trimethylsilylation of their surface (in accordance with U.S. Pat. No. 4,724,171, already mentioned in the introduction) by exposure to hexamethyldisilazane subsequent to the oxidative treatment in the known manner, were subjected to the same treatment in a package F.

Subsequent to the treatment sometimes described as a "tropical test" in the climatic chamber, the wafers were removed; from each group, the wetting angle was remeasured for 5 wafers in each case, while the remaining wafers were examined for whether the milky cloudiness usually described as "haze" and formed on the wafer surface in the climatic chamber. This investigation was carried out on the basis of the intensity of the diffuse scattered light originating from the wafer surface on irradiation with laser light and comparison with a perfect reference wafer.

In the case of the wafers from the package A, the wetting angle was unchanged at 65°. The wafer surfaces were completely "haze"-free.

In the case of the wafers from package B, the wetting angle had retained the value of 20°; the wafer surfaces revealed no "haze" of any kind.

In the case of the wafers from the package C, the wetting angle was unchanged at 60°. The wafer surfaces were completely "haze"-free.

In the case of the wafers from the package D, the wetting angle had increased from 60° to 64°; the wafer surfaces revealed no "haze" of any kind.

The wafers from the package E were still so strongly hydrophilic that the water drop applied drained off. However, the surfaces of all the wafers exhibited clear traces of "haze."

The wafers from the package F were clearly hydrophobic at the beginning and the end of the "tropical test" and exhibited an unchanged wetting angle of 45°. The wafer surfaces were completely free of "haze."

EXAMPLE 3

After the conclusion of the "tropical test," the wafers from the packages A to D were subjected to a treatment in aqueous acidic oxidative solution by immersion in aqueous hydrogen peroxide solution containing hydrochloric acid (one part of hydrochloric acid/one part of hydrogen peroxide/six parts of water, temperature approximately 75° C., period of time approximately 10 minutes) in order to render the applied silane layer hydrophilic again. The wafers were then washed and dried.

The water drop test then carried out revealed that all the drops applied to the wafer surface drained off, which revealed a strongly pronounced hydrophilic nature. Consequently, the wafers had been reconverted to a state corresponding to their hydrophilic surface state existing in the oxidative treatment by the hydrolytic treatment.

While only a single embodiment of the present invention has been shown and described, it is to be understood that many changes and modifications may be made thereunto without departing from the spirit and scope of the invention as defined by the appended claims.

What is claimed is:

1. A process for producing storage-stable surfaces of polished silicon wafers consisting essentially of:
   oxidative treatment of the silicon wafers;
   subsequently exposing the silicon wafers to an active organosilicon compound;
   selecting as said active organosilicon compound one which contains at least one radical in the compound which is hydrolyzably bound to silicon and at least one radical in the compound having hydrophilic properties;
   said active organosilicon compound containing a maximum of one carbon atom in the molecule directly bound to silicon per silicon atom;
   selecting as said hydrolyzably bound radical a radical selected from the group consisting of fluoro, chloro, bromo, hydroxy and alkoxy; and
   selecting as said radical having hydrophilic properties a radical selected from the group consisting of hydroxy, alkoxy and alkylcarboxy.

2. The process as claimed in claim 1, wherein the selected silicon wafers have at least one polished wafer surface.

3. The process as claimed in claim 1, wherein exposing to the organosilicon compound is carried out in the gas phase.

4. The process as claimed in claim 1, wherein said active organosilicon compound has a vapor pressure at 25° C. and 1000 hPa corresponding to at least 0.5 hPa.

5. The process as claimed in claim 1, wherein said oxidative treatment of the silicon wafers comprises contacting the wafers with an aqueous alkaline solution containing hydrogen peroxide, or with an aqueous acidic solution containing hydrogen peroxide.

6. The process as claimed in claim 1, wherein said oxidative treatment is carried on in an alkaline aqueous solution or an acidic aqueous solution.

7. A process for producing a storage-stable hydrophilic surface of a polished silicon wafer consisting essentially of:
   oxidative treatment of the silicon wafer;
   subsequently exposing the silicon wafer to an active organosilicon compound;
   selecting as said active organosilicon compound one which contains at least one radical in the compound which is hydrolyzably bound to silicon and at least one radical in the compound having hydrophilic properties,;

said active organosilicon compound containing a maximum of one carbon atom in the molecule directly bound to silicon per silicon atom;

selecting as said hydrolyzably bound radical a radical selected from the group consisting of fluoro, chloro, bromo, hydroxy and alkoxy;

selecting as said radical having hydrophilic properties a radical selected from the group consisting of hydroxy, alkoxy and alkylcarboxy; and producing a polished silicon wafer having a storage-stable hydrophilic surface.

8. The process of claim 7,
wherein the active organosilicon compound is selected from the group consisting of tetramethoxysilane, dimethoxymethychlorosilane, and the mixtures thereof.

9. The process as claimed in claim 1, wherein said alkoxy is selected from the group consisting of methoxy and ethoxy.

10. The process as claimed in claim 7, wherein said alkoxy is selected from the group consisting of methoxy and ethoxy.

* * * * *